(12) United States Patent
Matsumoto

(10) Patent No.: US 8,378,462 B2
(45) Date of Patent: Feb. 19, 2013

(54) SEMICONDUCTOR DEVICE HAVING THROUGH SUBSTRATE VIAS

(75) Inventor: Susumu Matsumoto, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/214,759

(22) Filed: Aug. 22, 2011

(65) Prior Publication Data

US 2011/0304057 A1 Dec. 15, 2011

Related U.S. Application Data

(63) Continuation of application No. PCT/JP2009/007346, filed on Dec. 28, 2009.

(30) Foreign Application Priority Data

Mar. 4, 2009 (JP) ................................. 2009-050758

(51) Int. Cl.
*H01L 29/40* (2006.01)
*H01L 23/053* (2006.01)
*H01L 23/12* (2006.01)
*H01L 23/48* (2006.01)
*H01L 23/52* (2006.01)
*H01L 23/02* (2006.01)

(52) U.S. Cl. ........ 257/621; 257/182; 257/700; 257/774; 257/E21.597; 257/E23.011

(58) Field of Classification Search .................. 257/182, 257/621, 700, 774, E21.597, E23.011
See application file for complete search history.

(56) References Cited

U.S. PATENT DOCUMENTS

| | | | | |
|---|---|---|---|---|
| 5,493,096 A | * | 2/1996 | Koh | 219/121.71 |
| 5,576,518 A | * | 11/1996 | Shibuya et al. | 174/264 |
| 6,106,890 A | * | 8/2000 | Hayashi | 427/96.7 |
| 6,703,310 B2 | * | 3/2004 | Mashino et al. | 438/666 |
| 6,790,775 B2 | * | 9/2004 | Fartash | 438/667 |
| 6,937,120 B2 | * | 8/2005 | Fisher et al. | 333/246 |
| 7,125,810 B2 | * | 10/2006 | Muta et al. | 438/758 |
| 7,276,738 B2 | * | 10/2007 | Wada | 257/98 |
| 7,301,108 B2 | * | 11/2007 | Egitto et al. | 174/262 |
| 7,358,602 B2 | * | 4/2008 | Hara | 257/689 |
| 7,408,120 B2 | * | 8/2008 | Kim et al. | 174/262 |
| 7,491,582 B2 | * | 2/2009 | Yokoyama et al. | 438/109 |

(Continued)

FOREIGN PATENT DOCUMENTS

| | | |
|---|---|---|
| JP | 09-205144 | 8/1997 |
| JP | 2006-060067 | 3/2006 |

(Continued)

OTHER PUBLICATIONS

D. S. Tezcan et al., "A New Scaled Through Si Via with Polymer Fill for 3D Wafer Level Packaging," Extended Abstracts of the 2008 International Conference on Solid State Devices and Materials, Tsukuba, 2008, pp. 52-53.

(Continued)

*Primary Examiner* — Ida M Soward
(74) *Attorney, Agent, or Firm* — McDermott Will & Emery LLP

(57) ABSTRACT

A semiconductor device includes a semiconductor substrate including a first surface serving as an element formation surface, and a second surface opposite to the first surface; a through-via penetrating the semiconductor substrate; an insulating via coating film formed between a sidewall of the through-via and the semiconductor substrate; and an insulating protective film formed on the second surface of the semiconductor substrate. The via coating film and the protective film are different insulating films from each other.

7 Claims, 14 Drawing Sheets

U.S. PATENT DOCUMENTS

| | | | |
|---|---|---|---|
| 7,629,541 B2 * | 12/2009 | Caletka et al. | 174/260 |
| 7,683,458 B2 * | 3/2010 | Akram et al. | 257/621 |
| 7,821,105 B2 * | 10/2010 | Morimoto | 257/621 |
| 7,968,460 B2 * | 6/2011 | Kirby et al. | 438/667 |
| 2006/0038300 A1 | 2/2006 | Tanida et al. | |
| 2006/0180938 A1 | 8/2006 | Kurihara et al. | |
| 2008/0164574 A1 * | 7/2008 | Savastiouk et al. | 257/621 |
| 2009/0278237 A1 * | 11/2009 | Cooney et al. | 257/621 |
| 2010/0320575 A9 * | 12/2010 | Chauhan | 257/621 |

FOREIGN PATENT DOCUMENTS

| | | |
|---|---|---|
| JP | 2006-253631 | 9/2006 |
| JP | 2007-005838 | 1/2007 |
| JP | 2007-281289 | 10/2007 |
| JP | 2008-300718 | 12/2008 |

OTHER PUBLICATIONS

O. Kato, "Development of Chip Stacking Technique Using Through-Electrode," OKI Technical Review Oct. 2007, Issue 211, vol. 74, No. 3, pp. 66-69.

* cited by examiner

SEMICONDUCTOR DEVICE HAVING THROUGH SUBSTRATE VIAS

CROSS-REFERENCE TO RELATED APPLICATION

This is a continuation of PCT International Application PCT/JP2009/007346 filed on Dec. 28, 2009, which claims priority to Japanese Patent Application No. 2009-050758 filed on Mar. 4, 2009. The disclosures of these applications including the specifications, the drawings, and the claims are hereby incorporated by reference in their entirety.

BACKGROUND

The present disclosure relates to semiconductor devices formed by three-dimensionally integrating semiconductor integrated circuits with through-vias and manufacturing methods of the devices.

In recent years, in order to proceed with miniaturization of packages with higher integration, higher function and higher speed of semiconductor integrated circuit devices, the industry has been fully studied three-dimensional packaging techniques of stacking a plurality of chips using through silicon vias. One of the techniques is described in for example, Deniz Sabuncuoglu Tezcan, Fabrice Duval, Ole Luhn, Philippe Soussan, and Bart Swinnen, A New Scaled Through Si Via with Polymer Fill for 3D Wafer Level Packaging, Extended Abstracts of the 2008 International Conference on Solid State Devices and Materials, Tsukuba (Japan), 2008, pp. 52-53. A manufacturing method of a through silicon via according to a conventional example will be described hereinafter with reference to the document.

FIGS. 13A-13F are cross-sectional views illustrating steps of the manufacturing of the through silicon via according to the conventional example.

As shown in FIG. 13A, after bonding an element formation surface of a silicon device wafer (silicon substrate) 101 to a glass carrier 105 with wax 104, polishing is performed from the back surface (an opposite surface to the element formation surface) of the silicon substrate 101 to thin the silicon substrate 101 to a thickness of about 50 μm.

After that, as shown in FIG. 13B, after a resist 106 having a ring-like pattern is formed on the back surface of the silicon substrate 101 by lithography, the silicon substrate 101 is etched using the resist 106 as a mask. This forms a ring-like groove 151 which reaches the interlayer film 102 covering the element formation surface of the silicon substrate 101. FIG. 14 is a top view of the ring-like groove 151.

Then, as shown in FIG. 13C, after removing the resist 106, an insulating polymer 107 is applied onto the back surface of the silicon substrate 101 to fill the ring-like groove 151.

Next, as shown in FIG. 13D, after a resist 108 having an opening over a circular region surrounded by the ring-like groove 151 is formed on the insulating polymer 107 by lithography, the insulating polymer 107 is etched using the resist 108 as a mask. This removes the portion of the insulating polymer 107, which is positioned in the circular region surrounded by the ring-like groove 151.

After that, as shown in FIG. 13E, the portion of the silicon substrate 101, which is positioned in the circular region surrounded by the ring-like groove 151 is removed by dry etching, thereby forming a via hole 152 reaching the interlayer film 102. Then, the interlayer film 102 on the bottom of the via hole 152 is removed by wet etching. This exposes an interconnect 103 formed on the interlayer film 102 covering the element formation surface of the silicon substrate 101.

Next, after removing the resist 108, a seed layer 109 is formed to cover the side surface and the bottom surface of the via hole 152 as shown in FIG. 13F. Then, after forming a resist pattern 110 having an opening in an interconnect formation region, copper plating is performed to fill the via hole 152 with the copper film 111. Finally, although not shown in the figure, a through silicon via electrode is completed by removing the resist pattern 110 and the underlying seed layer 109.

According to the above-described method of the conventional example, the insulating polymer 107, which has a lower dielectric constant and a lower coefficient of elasticity than an insulating film formed by chemical vapor deposition (CVD), can be formed between the silicon substrate 101 and the through-via (the copper film 111). This reduces parasitic capacitance caused by the through-via. Furthermore, since the insulating polymer 107 serves as a buffer material, stress mismatch caused by a difference in the coefficient of thermal expansion between the silicon substrate 101 and the through-via (copper film 111) can be reduced.

SUMMARY

However, according to the above-described conventional example, the ring-like groove, which is formed in the silicon substrate to be filled with an insulating polymer, has a high aspect ratio. Thus, the filling with the insulating polymer becomes difficult in accordance with miniaturization. This results in difficulty in achieving miniaturization, higher integration, and lower costs in the future, in a semiconductor device formed by three-dimensionally integrating semiconductor integrated circuits by a through-via.

In view of this, it is an objective of the present disclosure to achieve miniaturization, higher integration, and lower costs in a semiconductor device formed by three-dimensionally integrating a semiconductor integrated circuit by a through-via. It is also an objective to improve reliability by reducing parasitic capacitance caused by the through-via, and by reducing stress mismatch caused by a difference in the coefficient of thermal expansion between the material of a substrate and the material of the through-via.

In order to achieve the objective, a manufacturing method of a semiconductor device according to the present disclosure includes the steps of: (a) forming a via hole to penetrate a semiconductor substrate including a first surface serving as an element formation surface, and a second surface opposite to the first surface; (b) filling the via hole with an insulating via coating material; (c) removing the via coating material while retaining as a via coating film, a portion of the via coating material which covers an inner wall of the via hole; and (d) forming a through-via penetrating the semiconductor substrate by filling with a conductive film, the via hole in which the via coating film remains.

In the manufacturing method of the semiconductor device according to the present disclosure may further include, before the step (a), the step of forming an insulating protective film on the second surface of the semiconductor substrate. In the step (a), the via hole may be formed to penetrate the protective film. The steps of (b1) removing the via coating material filling a portion of the via hole in the protective film, (b2) forming an insulating film on the via coating material remaining inside the via hole, and (b3) removing the insulating film, while retaining a portion of the insulating film which covers the inner wall of the portion of the via hole in the protective film, are performed between the step (b) and the step (c). In the step (c), the via coating material remaining inside the via hole may be etched using as a mask, the insulating film remaining on the inner wall of the portion of the via hole in the protective film. In this case, the insulating film may be made of a material more resistant to etching than the via coating material.

In the manufacturing method of the semiconductor device according to the present disclosure may further include, before the step (a), the step of forming an insulating protective film on the second surface of the semiconductor substrate. In the step (a), the via hole may be formed to penetrate the protective film. In the step (c), the via coating material may be retained as the via coating film, on the inner wall of the portion of the via hole in the protective film. In this case, in the step (b), the via coating material may be formed to reach a top of the protective film. In the step (c), the via coating material may be retained on the top of the protective film as the via coating film.

In the manufacturing method of the semiconductor device according to the present disclosure, the via coating material may be made of an insulating polymer.

A semiconductor device according to the present disclosure includes a semiconductor substrate including a first surface serving as an element formation surface, and a second surface opposite to the first surface; a through-via penetrating the semiconductor substrate; an insulating via coating film formed between a sidewall of the through-via and the semiconductor substrate; and an insulating protective film formed on the second surface of the semiconductor substrate. The via coating film and the protective film are different insulating films from each other.

In the semiconductor device according to the present disclosure, an end of the via coating film closer to the second surface may be positioned in a substantially same plane as the second surface of the semiconductor substrate. An insulating film different from the protective film is formed to cover the end of the via coating film closer to the second surface.

In the semiconductor device according to the present disclosure, an end of the via coating film closer to the second surface may be positioned in a substantially same plane as a surface of the protective film.

In the semiconductor device according to the present disclosure, the via coating film may be formed to reach a top of the protective film.

In the semiconductor device according to the present disclosure, the via coating film may be made of an insulating polymer.

As described above, according to the semiconductor device and the manufacturing method of the device of the present disclosure, the via coating film having a low dielectric constant can be formed thin on the sidewall of the through-via in a self-aligned manner, thereby reducing parasitic capacitance caused by the through-via. Also, the via coating film having a low coefficient of elasticity functions as a buffer material, stress mismatch caused by a difference in the coefficient of thermal expansion between the material of the substrate and the material of the through-via can be reduced. Therefore, a semiconductor device formed by three-dimensionally integrating semiconductor integrated circuits by a highly reliable through-via can be provided with low costs, and the semiconductor device can be further miniaturized and integrated.

That is, the present disclosure achieves miniaturization, higher integration, and lower costs in a semiconductor device formed by three-dimensionally integrating semiconductor integrated circuits by a through-via, and improves reliability by reducing parasitic capacitance caused by the through-via, and by reducing stress mismatch caused by a difference in the coefficient of thermal expansion between the material of a substrate and the material of the through-via. Therefore, the present disclosure is extremely useful.

DETAILED DESCRIPTION

First Embodiment

A manufacturing method of a semiconductor device according to a first embodiment of the present disclosure will be described hereinafter with reference to FIGS. 1A-1H. Note that materials, numerical values, etc. used in this embodiment are merely examples, and the present disclosure is not limited thereto. This embodiment may be modified as appropriate without departing from the technical spirit and scope of the present disclosure. Furthermore, a combination of this embodiment and the other embodiment is possible.

Figure 1A:
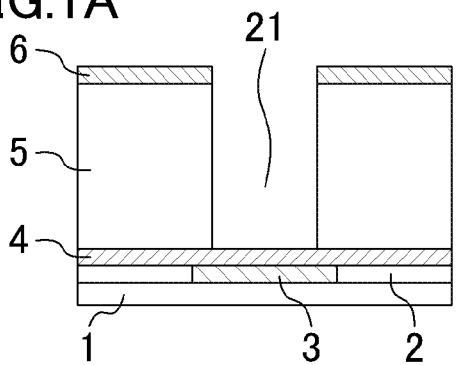
FIGS. 1A-1H are cross-sectional views illustrating steps of a manufacturing method of a semiconductor device according to a first embodiment of the present disclosure.

First, as shown in FIG. 1A, an element formation surface of a silicon device wafer (semiconductor substrate such as a silicon substrate) 5 is bonded onto a glass carrier 1 by wax 2. Then, the silicon device wafer 5 is polished from a back surface (surface opposite to the element formation surface) to a thickness of, e.g., about 50 µm with the element formation surface facing downward.

In this embodiment, a first insulating film (front surface protective film) 4 is formed on the element formation surface of the silicon device wafer 5. A metal film 3 serves as an interconnect, a pad, or the like is formed on a surface of the first insulating film 4. When the metal film 3 serves as an interconnect, the metal film 3 may be formed inside the first insulating film 4. However, the figure shows that the metal film 3 is formed on the surface of the first insulating film 4 for simplicity of description. The glass carrier 1 is a tool for handing the silicon device wafer 5.

Then, a second insulating film (back surface protective film) 6 which is, e.g., a silicon nitride (SiN) film etc. and has a thickness of about 1 μm, is formed on the back surface of the polished silicon device wafer 5. After that, a via hole 21 having a via size of, e.g., 10 μm and penetrating the second insulating film 6 and the silicon device wafer 5 is formed to reach the first insulating film 4.

Figure 1B:
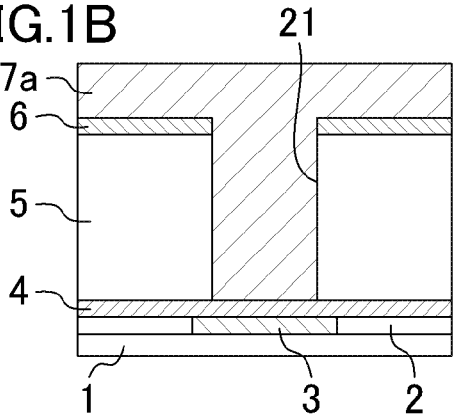

Next, as shown in FIG. 1B, a third insulating film 7a made of, e.g., an insulating polymer etc. and having a thickness of about 5 μm is deposited on the second insulating film 6 including the inside of the via hole 21 to fill the via hole 21.

Figure 1C:
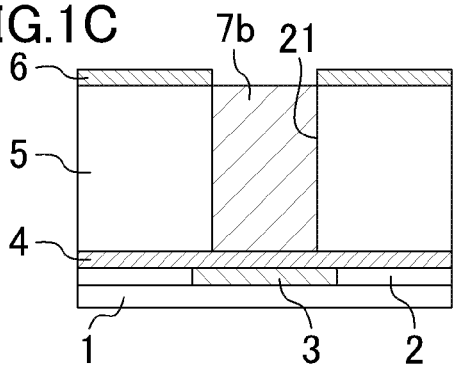

After that, as shown in FIG. 1C, the portion of the third insulating film 7a which is positioned on the second insulating film 6, and the third insulating film 7a formed in a portion of the via hole 21 in the second insulating film 6 are removed to provide a dummy plug 7b formed of the third insulating film 7a.

Figure 1D:
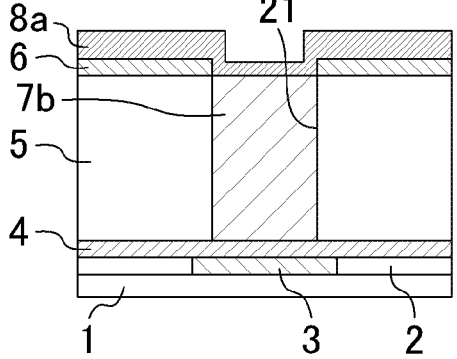

Then, as shown in FIG. 1D, a fourth insulating film 8a having a thickness of, e.g., about 1 μm and having etching selectivity for the third insulating film 7a (i.e., dummy plug 7b) is formed on the dummy plug 7b and on the second insulating film 6.

Figure 1E:
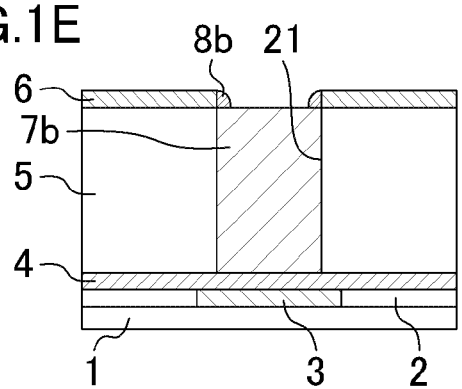

Next, as shown in FIG. 1E, the fourth insulating film 8a is subject to anisotropic etch-back, thereby forming a sidewall 8b formed of the fourth insulating film 8a on the inner wall of the portion of the via hole 21 in the second insulating film 6.

Figure 1F:
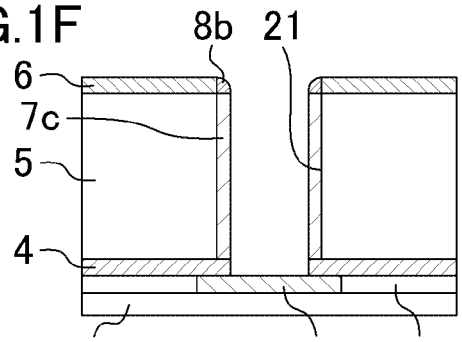

After that, as shown in FIG. 1F, the dummy plug 7b and the first insulating film 4 are etched using the sidewall 8b as a mask to expose the metal film 3 at the bottom of the via hole 21. This forms a via coating film 7c, which is the residual portion of the dummy plug 7b (third insulating film 7a), on the inner wall of the portion of the via hole 21 in the silicon device wafer 5. In this embodiment, the end of the via coating film 7c closer to the back surface of the silicon device wafer 5 is positioned in a substantially same plane as the back surface of the silicon device wafer 5. The sidewall 8b formed of the fourth insulating film 8a different from the second insulating film (back surface protective film) 6 is provided to cover the end of the via coating film 7c closer to the back surface of the silicon device wafer 5.

Figure 1G:
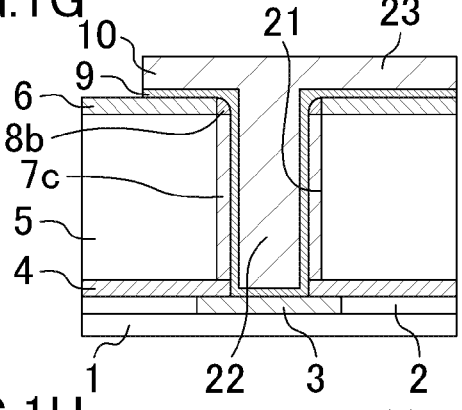

Then, as shown in FIG. 1G, a barrier metal film 9 made of, e.g., Ti and having a thickness of about 1 μm, and a seed film (not shown) having a thickness of, e.g., about 1 μm are deposited to cover the inner wall and the bottom of the via hole 21. After that, for example, copper plating is performed using as a mask, a resist pattern (not shown) having an opening in an interconnect formation region to fill the via hole 21 with a conductive film 10. Next, the resist pattern as well as the underlying unnecessary barrier metal film 9 and seed film are removed. As a result, a through-via 22 is formed, and an interconnect 23 connected to the through-via 22 is formed.

Figure 1H:
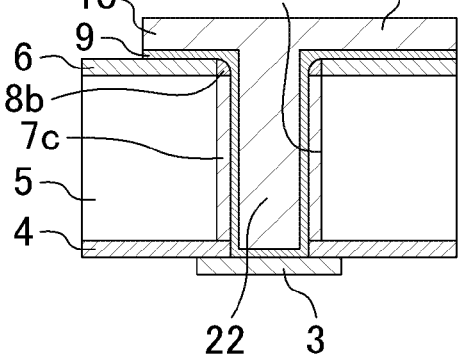

Next, as shown in FIG. 1H, the glass carrier 1 and the wax 2 are removed to complete a device including the through-via 22.

The above-described manufacturing method of the semiconductor device according to the first embodiment provides the advantage of forming the via coating film 7c on the sidewall of the through-via 22 without increasing the number of masks. Specifically, while three masks are required in the conventional example shown in FIGS. 13A-13F, two masks suffice in this embodiment. This lowers costs in this embodiment as compared to the conventional example.

In this embodiment, the thickness of the fourth insulating film 8a when being deposited is adjusted to control the thickness (width in the direction parallel to the principal surface of the substrate) of the sidewall 8b formed on the inner wall of the portion of the via hole 21 in the second insulating film 6. Thus, the via coating film 7c formed by using the sidewall 8b as a mask can be thinned in a self-aligned manner. This is extremely advantageous in forming a fine through-via 22. Furthermore, the via coating film 7c can be thinned, thereby reducing parasitic capacitance caused by the through-via 22, and reducing stress mismatch caused by a difference in a coefficient of thermal expansion between the material of the substrate (silicon device wafer 5) and the material of the through-via 22 (conductive film 10).

In the conventional example shown in FIGS. 13A-13F, the ring-like groove, which is formed in the silicon substrate to be filled with an insulating polymer, has a high aspect ratio. There is thus the problem that the filling with the insulating polymer becomes difficult in accordance with miniaturization. By contrast, in this embodiment, the third insulating film 7a which becomes the via coating film 7c fills the entire via hole 21 having a lower aspect ratio than the ring-like groove of the conventional example. The low aspect ratio (i.e., a large opening) increases the filling margin, thereby easily achieving miniaturization of the through-via 22.

Note that, in the manufacturing method of the semiconductor device according to the first embodiment, the insulating polymer is used as the via coating film 7c (third insulating film 7a) formed on the sidewall of the through-via 22. Instead of the insulating polymer, an insulating film such as a methylsilses-quioxane (MSQ) film may be used. As the insulating polymer, a material having a low dielectric constant, a low coefficient of elasticity, and excellent filling characteristics is preferably used. For example, a fluorinated polymer, a hydrocarbon-based polymer, a coating material such as benzocyclobutene (BCB), etc. are preferably used.

In this embodiment, as the fourth insulating film 8a (sidewall 8b) used as a mask when forming the via coating film 7c on the sidewall of the through-via 22, an insulating film is preferably used, which is more resistant to etching than the third insulating film 7a which becomes the via coating film 7c. Specifically, when an insulating polymer is used as the via coating film 7c (third insulating film 7a), an insulating film having high etching selectivity for the insulating polymer, for example, a silicon nitride film formed by CVD, a silicon carbide film, a silicon oxide film, or the like is preferably used as the fourth insulating film 8a.

While in this embodiment, the copper film is used as the conductive film 10 constituting the through-via 22, a conductive film made of, e.g., tungsten, gold, etc. may be used instead.

While in this embodiment, a silicon nitride film is used as the second insulating film 6 formed on the back surface of the silicon device wafer 5, for example, a silicon carbide film may be used instead. As such, when a silicon nitride film or a silicon carbide film is used, etching selectivity for an insulating polymer can be increased, thereby reducing the amount of etching of the second insulating film 6.

Next, the structure of a semiconductor device according to the first embodiment of the present disclosure will be described hereinafter with reference to FIG. 2.

Figure 2:
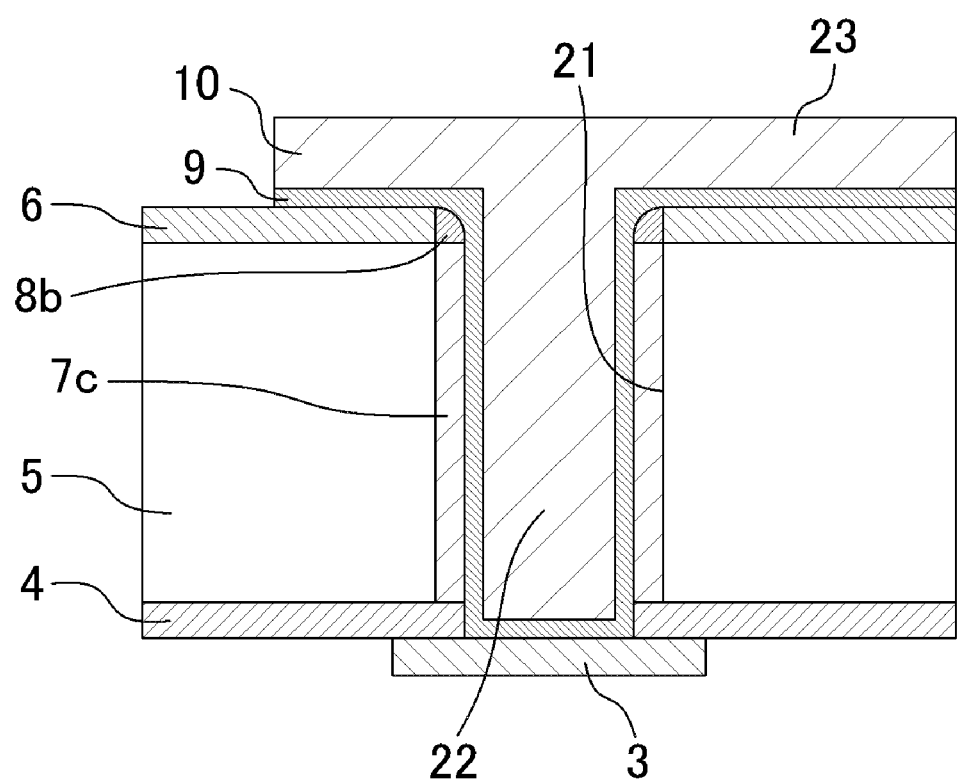
FIG. 2 is a cross-sectional view illustrating the semiconductor device according to the first embodiment.

As shown in FIG. 2, a silicon device wafer 5 includes a first surface (element formation surface) provided with an impurity region (not shown) of each of active elements such transistors and diodes, and a second surface (back surface) opposite to the first surface. A first insulating film (front surface protective film) 4 is formed on the first surface of the silicon device wafer 5. A metal film 3 serves as an interconnect, a pad, or the like is formed on a surface of the first insulating film 4. When the metal film 3 serves as an interconnect, the metal film 3 may be formed inside the first insulating film 4. However, the figure shows that the metal film 3 is formed on the surface of the first insulating film 4 for simplicity of description. A second insulating film (back surface protective film) 6 is formed on the second surface of the silicon device wafer 5. A through-via 22 is formed to penetrate the silicon device wafer 5 from the first surface to the second surface. The through-via 22 is formed by sequentially filling the via hole 21 with a barrier metal film 9 and a conductive film 10. An insulating via coating film 7c is formed between the sidewall of the through-via 22 and the silicon device wafer 5. Specifically, the via hole 21 is formed to penetrate the second insulating film 6 and the silicon device wafer 5. The via coating film 7c on the inner wall of the portion of the via hole 21 in the silicon device wafer 5. A sidewall 8b is formed on the inner wall of the portion the via hole 21 in the second insulating film 6 to come into contact with the via coating film 7c.

Note that the portion of the conductive film 10 for filling the via hole 21, which protrudes from the via hole 21 is an interconnect (interconnect 23) for providing electrical connection with an element on the element formation surface of the silicon device wafer 5 via the though-via 22. The through-via 22 is formed to penetrate the first insulating film 4 to be connected to the metal film 3 on the element formation surface of the silicon device wafer 5.

In the above-described semiconductor device according to the first embodiment, the second insulating film 6, the via coating film 7c, and the sidewall 8b prevent the contact of the barrier metal film 9 and the conductive film 10 which constitute the through-via 22 with the silicon device wafer 5. Also, since the via coating film 7c having a low dielectric constant can be formed between the silicon device wafer 5 and the through-via 22, parasitic capacitance caused by the through-via 22 can be reduced.

Note that, in the semiconductor device according to the first embodiment, an insulating polymer or an insulating film such as an MSQ film may be used as the via coating film 7c (third insulating film 7a) formed on the sidewall of the through-via 22. As the insulating polymer, a material having a low dielectric constant, a low coefficient of elasticity, and excellent filling characteristics is preferably used. For example, a fluorinated polymer, a hydrocarbon-based polymer, a coating material such as benzocyclobutene (BCB), etc. is preferably used.

In the semiconductor according to the first embodiment, as the sidewall 8b (fourth insulating film 8a) formed on the inner wall of the portion of the via hole 21 in the second insulating film 6, an insulating film is preferably used, which is more resistant to etching than the third insulating film 7a which becomes the via coating film 7c. Specifically, when an insulating polymer is used as the via coating film 7c (third insulating film 7a), an insulating film having high etching selectivity for the insulating polymer, for example, a silicon nitride film formed by CVD, a silicon carbide film, a silicon oxide film, or the like is preferably used as the fourth insulating film 8a.

In the semiconductor according to the first embodiment, a copper film or a conductive film made of, e.g., tungsten, gold, etc. may be used as the conductive film 10 constituting the through-via 22.

In the semiconductor according to the first embodiment, a silicon nitride film, or for example, a silicon carbide film may be used as the second insulating film 6 formed on the back surface of the silicon device wafer 5. As such, when a silicon nitride film or a silicon carbide film is used, etching selectivity for an insulating polymer can be increased, thereby reducing the amount of etching of the second insulating film 6.

First Variation of First Embodiment

A manufacturing method of a semiconductor device according to a first variation of the first embodiment of the present disclosure will be described hereinafter with reference to FIGS. 3A-3H. Note that materials, numerical values, etc. used in this variation are merely examples, and the present disclosure is not limited thereto. This variation may be modified as appropriate without departing from the technical spirit and scope of the present disclosure. Furthermore, a combination of this variation and the other embodiment or the other variations is possible. Moreover, the steps shown in FIGS. 3A, 3B, 3G, and 3H of this variation are similar to the steps shown in FIGS. 1A, 1B, 1G, and 1H of the first embodiment, and explanation thereof will be omitted.

Figure 3A:
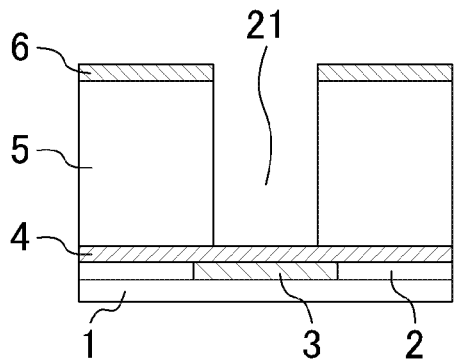
FIGS. 3A-3H are cross-sectional views illustrating steps of a manufacturing method of a semiconductor device according to a first variation of the first embodiment.
Figure 3B:
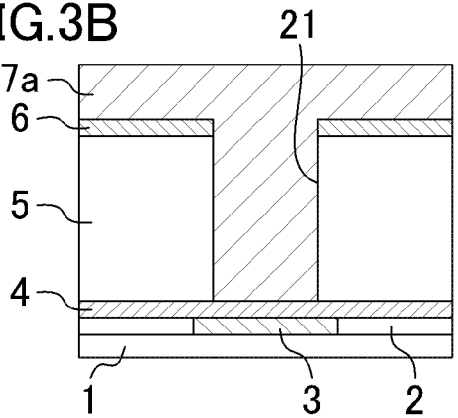

That is, in this variation, the steps shown in FIGS. 3A and 3B are performed similar to the steps shown in FIGS. 1A and 1B of the first embodiment.

Figure 3C:
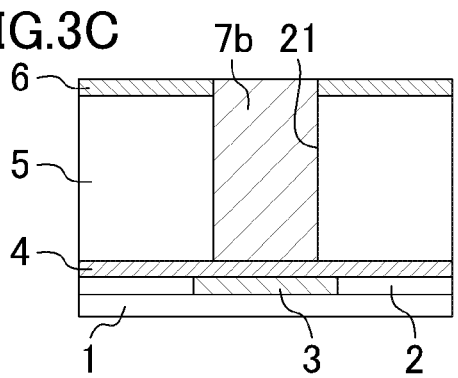

Then, as shown in FIG. 3C, the portion of a third insulating film 7a, which is positioned higher than a second insulating film 6, is removed to form a dummy plug 7b formed of the third insulating film 7a.

Figure 3D:
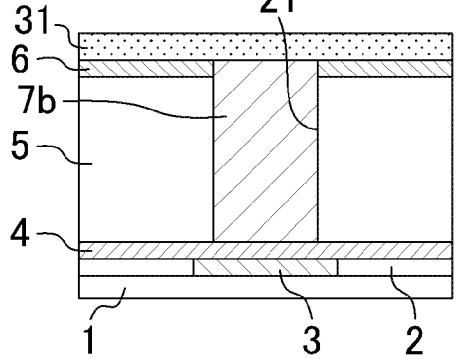

Next, as shown in FIG. 3D, a resist film 31 with a thickness of, e.g., about 1 μm is formed on the dummy plug 7b and the second insulating film 6.

Figure 3E:
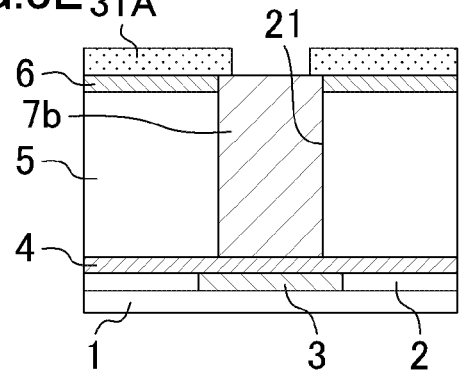

After that, as shown in FIG. 3E, the resist film 31 is patterned by lithography to form a resist pattern 31A covering the second insulating film 6 and a via coating film formation region.

Figure 3F:
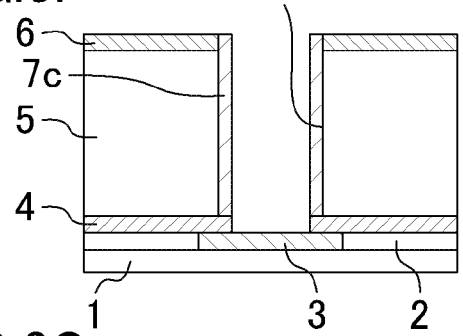

Then, as shown in FIG. 3F, after the dummy plug 7b and a first insulating film 4 are etched using a resist pattern 31A as a mask to expose a metal film 3 at the bottom of the via hole 21, the resist pattern 31A is removed. As a result, a via coating film 7c, which is the residual portion of the dummy plug 7b (third insulating film 7a), is formed on the inner wall of the via hole 21. In this variation, the end of the via coating film 7c closer to the back surface of the silicon device wafer 5 is positioned in a substantially same plane as the surface of the second insulating film 6.

Figure 3G:
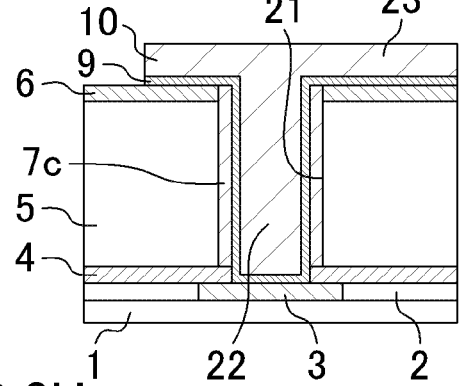
Figure 3H:
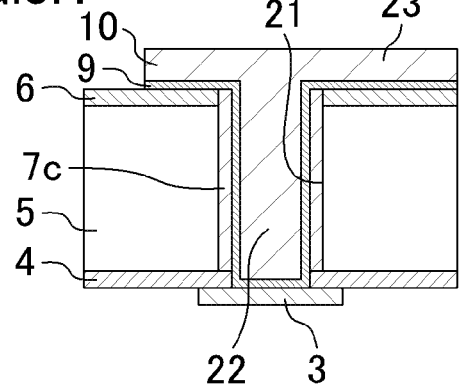

After that, the steps shown in FIGS. 3G and 3H are performed similar to the steps shown in FIGS. 1G and 1H of the first embodiment.

Unlike this variation described above where the via coating film 7c made of an insulating polymer is formed by using the sidewall 8b as a mask, the via coating film 7c made of an insulating polymer may be formed by using the resist pattern 31A as a mask. In this variation, as well, the third insulating film 7a which becomes the via coating film 7c fills the entire via hole 21 having a lower aspect ratio than the ring-like groove of the conventional example. Thus, the low aspect ratio (i.e., a large opening) increases the filling margin, thereby easily achieving miniaturization of the through-via 22.

Next, the semiconductor device according to the first variation of the first embodiment of the present disclosure will be described hereinafter with reference to FIG. 4.

Figure 4:
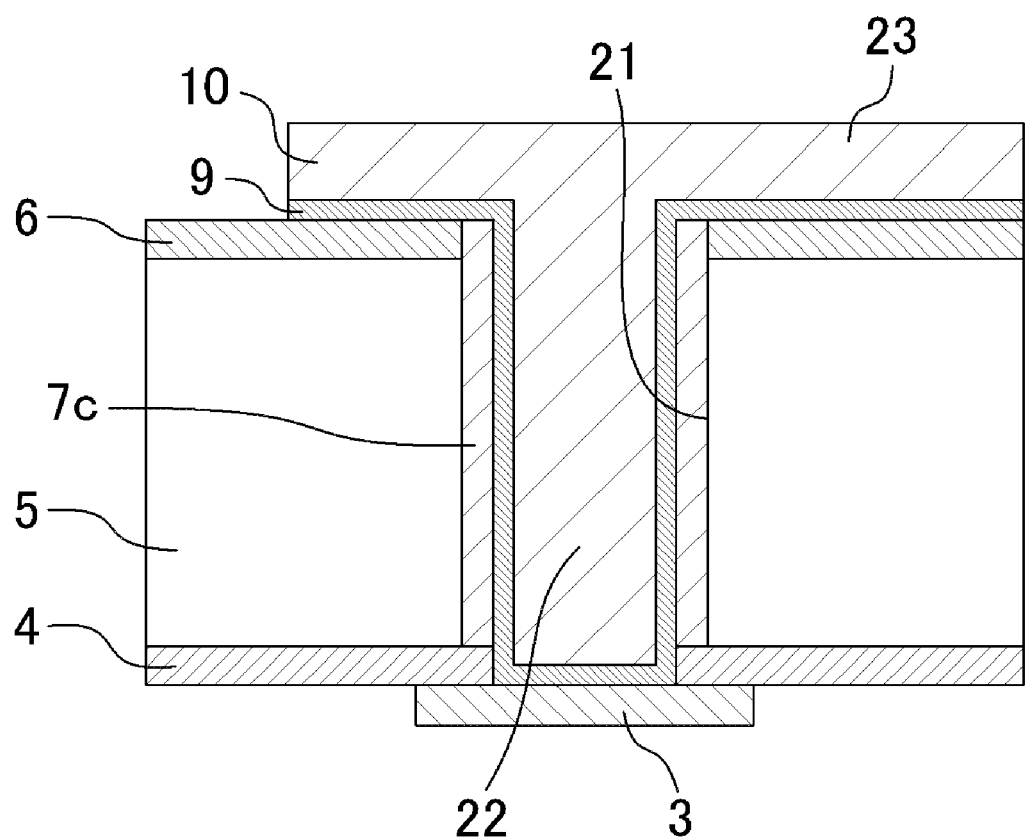
FIG. 4 is a cross-sectional view illustrating the semiconductor device according to the first variation of the first embodiment.

The semiconductor device according to this variation shown in FIG. 4 differs from the semiconductor device according to the first embodiment shown in FIG. 2 in that the via coating film 7c covers the sidewall of the portion of the through-via 22 in the second insulating film (back surface protective film) 6 on the second surface (back surface) of the silicon device wafer 5. As such, the via coating film 7c made of an insulating polymer having a low dielectric constant covers the uppermost portion of the through-via 22, thereby reducing capacitance between the upper corner of the through-via 22 and the silicon device wafer 5 to provide the advantage of increasing speed. As compared to the first embodiment, the interface between the via coating film 7c and the sidewall 8b does not exist, degradation in yield caused by etching at the interface, or a leakage current into the silicon device wafer 5 via the interface can be prevented to improve reliability.

Second Variation of First Embodiment

A manufacturing method of a semiconductor device according to a second variation of the first embodiment of the present disclosure will be described hereinafter with reference to FIGS. 5A-5H. Note that materials, numerical values, etc. used in this variation are merely examples, and the present disclosure is not limited thereto. This variation may be modified as appropriate without departing from the technical spirit and scope of the present disclosure. Furthermore, a combination of this variation and the other embodiment or the other variations is possible. Moreover, the steps shown in FIGS. 5A, 5B, and 5D-5H of this variation are similar to the steps shown in FIGS. 3A, 3B, and 3D-3H of the first variation of the first embodiment, and explanation thereof will be omitted.

Figure 5A:
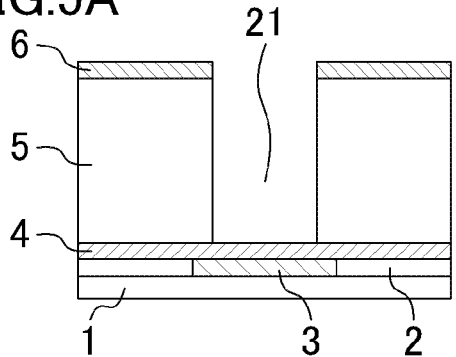
FIGS. 5A-5H are cross-sectional views illustrating steps of a manufacturing method of a semiconductor device according to a second variation of the first embodiment.
Figure 5B:
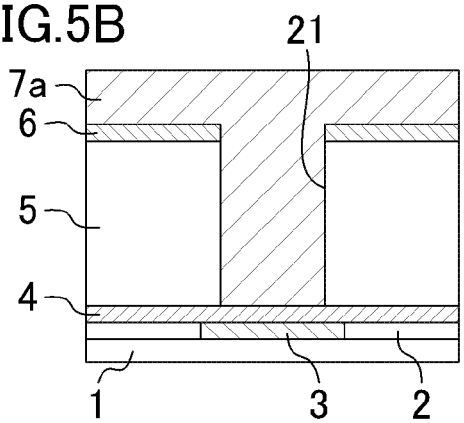

In this variation, first, the steps shown in FIGS. 5A and 5B are performed similar to the steps shown in FIGS. 3A and 3B of the first variation of the first embodiment.

Figure 5C:
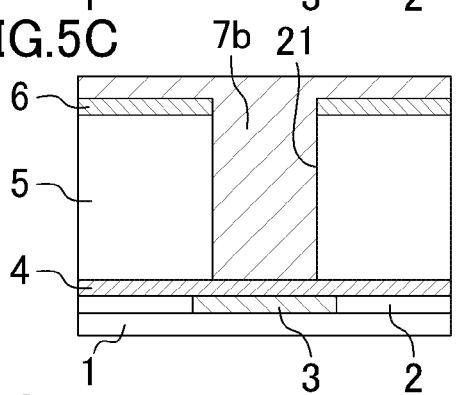
Figure 5D:
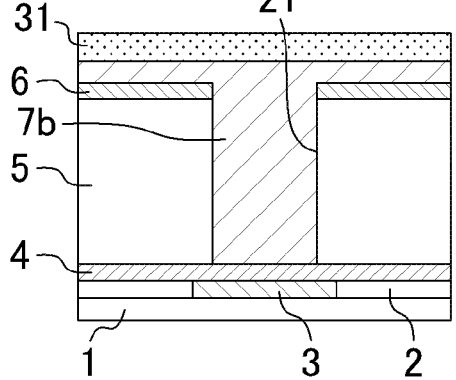
Figure 5E:
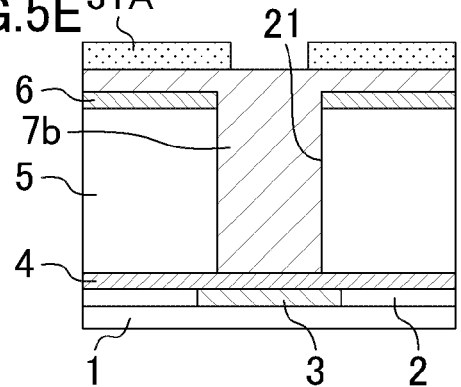
Figure 5F:
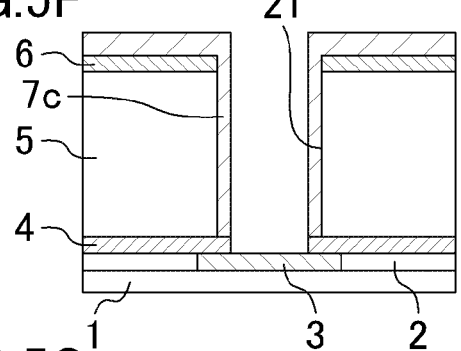
Figure 5G:
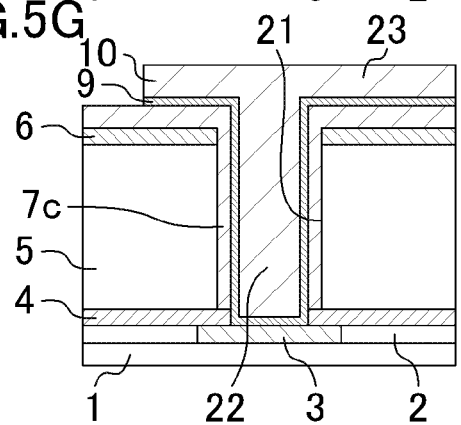
Figure 5H:
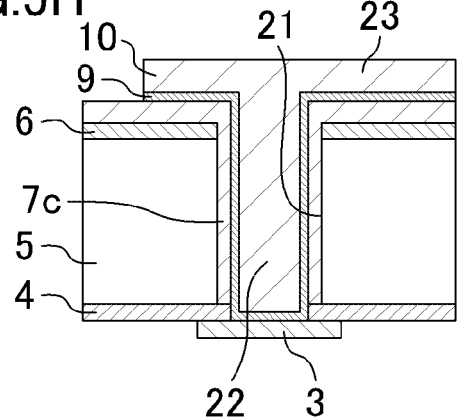

Then, as shown in FIG. 5C, the portion of a third insulating film 7a, which is positioned higher than the surface of a second insulating film 6, is thinned to form a dummy plug 7b formed of the third insulating film 7a. The third insulating film 7a constituting the dummy plug 7b also remains on the surface of the second insulating film 6.

After that, the steps shown in FIGS. 5D-5H are performed similar to the steps shown in FIGS. 3D-3H of the first variation of the first embodiment. This forms a via coating film 7c, which is the residual portion of the dummy plug 7b (third insulating film 7a), on the inner wall of the via hole 21 and the surface of the second insulating film 6.

As in this variation described above, the via coating film 7c may remain on the surface of the second insulating film 6 formed on the back surface of the silicon device wafer 5. In this variation, as well, the third insulating film 7a which becomes the via coating film 7c fills the entire via hole 21 having a lower aspect ratio than the ring-like groove of the conventional example. Thus, the low aspect ratio (i.e., a large opening) increases the filling margin, thereby easily achieving miniaturization of the through-via 22.

Next, the semiconductor device according to the second variation of the first embodiment of the present disclosure will be described hereinafter with reference to FIG. 6.

Figure 6:
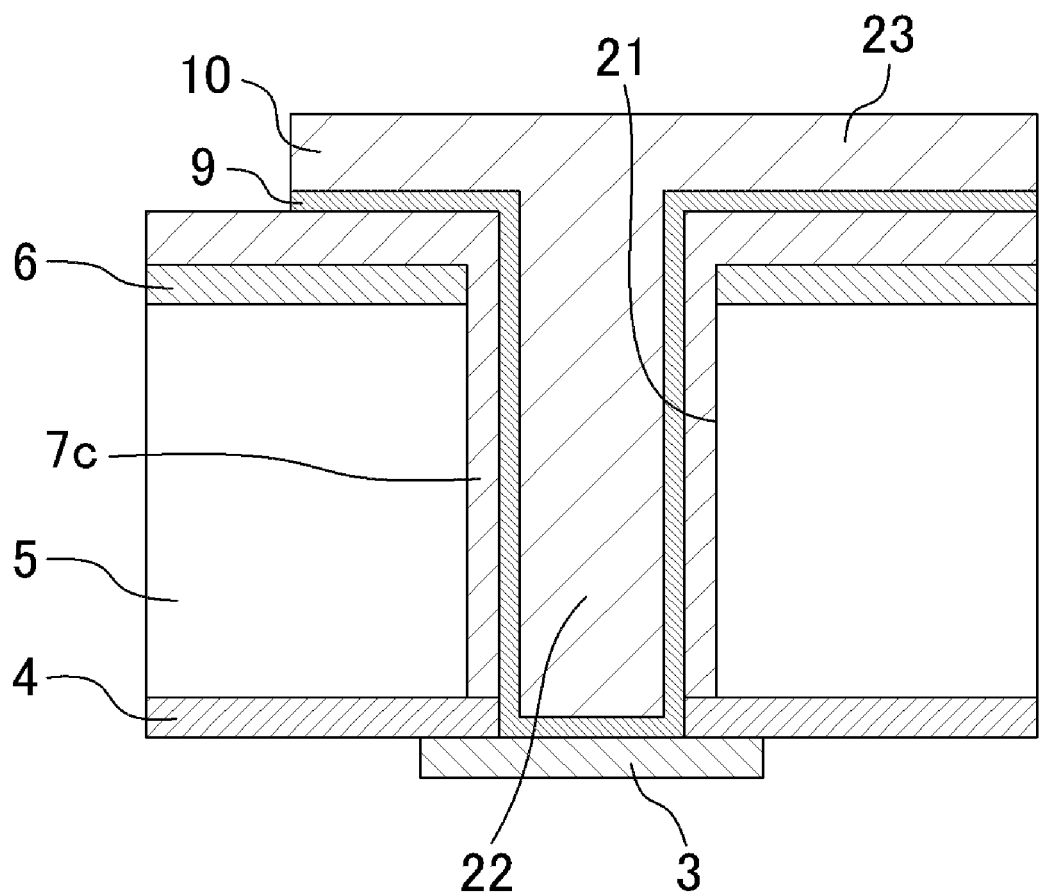
FIG. 6 is a cross-sectional view illustrating the semiconductor device according to the second variation of the first embodiment.

The semiconductor device according to this variation shown in FIG. 6 differs from the semiconductor device according to the first embodiment shown in FIG. 2 in that the via coating film 7c is also provided on the surface of the second insulating film 6 formed on the back surface (second surface) of the silicon device wafer 5. As a result, an insulating film exists which is continuously formed from the sidewall of the through-via 22 to the second surface of the silicon device wafer 5, thereby sufficiently obtaining insulation between the silicon device wafer 5 and the through-via 22. Furthermore, a structure formed by stacking the second insulating film 6 and the via coating film 7c (third insulating film 7a) is obtained on the second surface of the silicon device wafer 5, thereby improving insulation of the second surface of the silicon device wafer 5. Moreover, the via coating film 7c made of an insulating polymer having a low dielectric constant covers the uppermost portion of the through-via 22, thereby reducing capacitance between the upper corner of the through-via 22 and the silicon device wafer 5 to provide the advantage of increasing speed. As compared to the first embodiment, the interface between the via coating film 7c and the sidewall 8b does not exist, degradation in yield caused by etching at the interface, or a leakage current into the silicon device wafer 5 via the interface can be prevented to improve reliability.

Third Variation of First Embodiment

A manufacturing method of a semiconductor device according to a third variation of the first embodiment of the present disclosure will be described hereinafter with reference to FIGS. 7A-7G. Note that materials, numerical values, etc. used in this variation are merely examples, and the present disclosure is not limited thereto. This variation may be modified as appropriate without departing from the technical spirit and scope of the present disclosure. Furthermore, a combination of this variation and the other embodiment or the other variations is possible. Moreover, the steps shown in FIGS. 7B-7G of this variation are similar to the steps shown in FIGS. 5C-5H of the second variation of the first embodiment, and explanation thereof will be omitted.

Figure 7A:
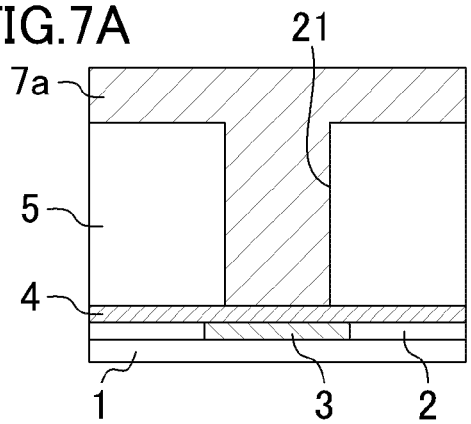
FIGS. 7A-7G are cross-sectional views illustrating steps of a manufacturing method of a semiconductor device according to a third variation of the first embodiment.
Figure 7B:
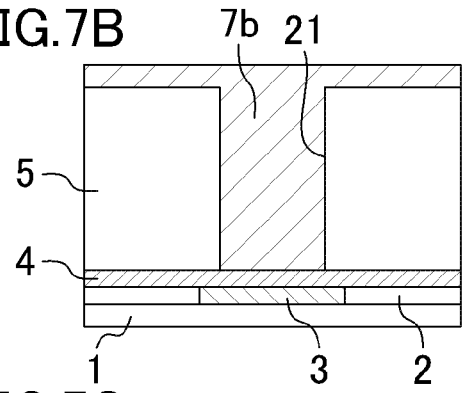
Figure 7C:
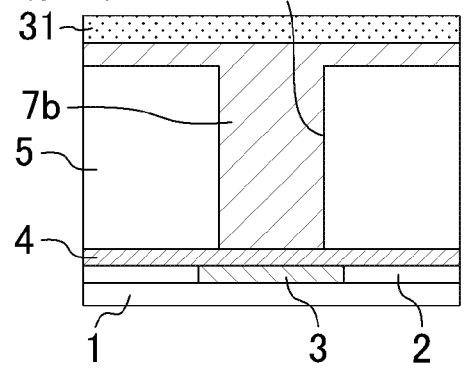
Figure 7D:
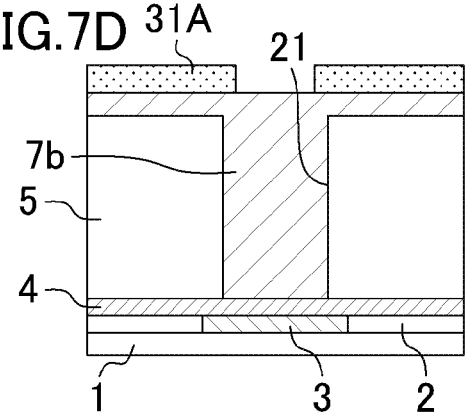
Figure 7E:
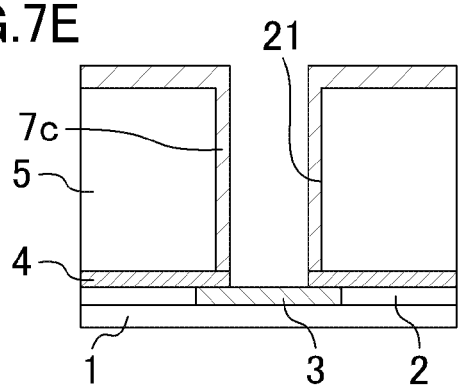
Figure 7F:
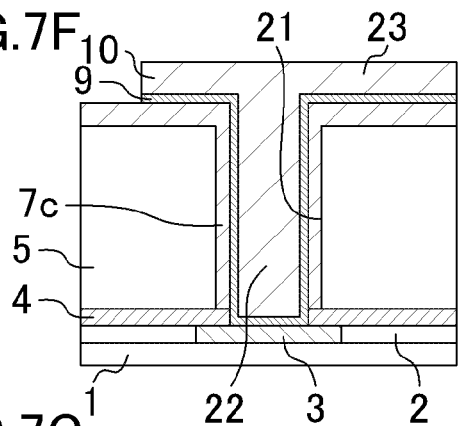
Figure 7G:
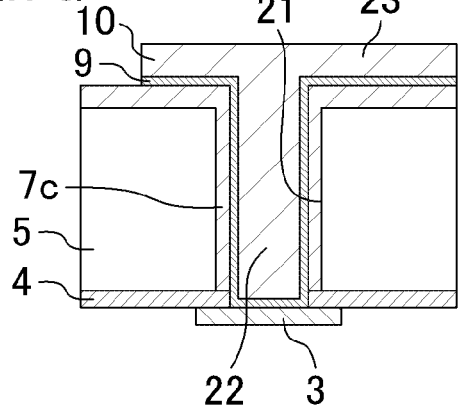

First, as shown in FIG. 7A, an element formation surface of a silicon device wafer 5 is bonded onto a glass carrier 1 by wax 2. Then, the silicon device wafer 5 is polished from a back surface to a thickness of, e.g., about 50 μm with the element formation surface facing downward.

In this embodiment, a first insulating film (front surface protective film) 4 is formed on the element formation surface of the silicon device wafer 5. A metal film 3 serves as an interconnect, a pad, or the like is formed on a surface of the first insulating film 4. When the metal film 3 serves as an interconnect, the metal film 3 may be formed inside the first insulating film 4. However, the figure shows that the metal film 3 is formed on the surface of the first insulating film 4 for simplicity of description. The glass carrier 1 is a tool for handing the silicon device wafer 5.

Then, a via hole 21 penetrating the silicon device wafer 5 and having a via size of 10 μm is formed to reach the first insulating film 4.

Next, the steps shown in FIGS. 7B-7G are performed similar to the steps shown in FIGS. 5C-5H of the second variation of the first embodiment. This forms a via coating film 7c, which is the residual portion of the dummy plug 7b (third insulating film 7a), on the inner wall of the via hole 21 and the back surface of the silicon device wafer 5.

As in this variation described above, when the step of forming the second insulating film 6 on the back surface of the silicon device wafer 5 is omitted, the via coating film 7c (third insulating film 7a) may be formed on the back surface of the silicon device wafer 5 instead of the second insulating film 6. In this variation, as well, the third insulating film 7a which becomes the via coating film 7c fills the entire via hole 21 having a lower aspect ratio than the ring-like groove of the conventional example. Thus, the low aspect ratio (i.e., a large opening) increases the filling margin, thereby easily achieving miniaturization of the through-via 22.

Next, the semiconductor device according to the third variation of the first embodiment of the present disclosure will be described hereinafter with reference to FIG. 8.

Figure 8:
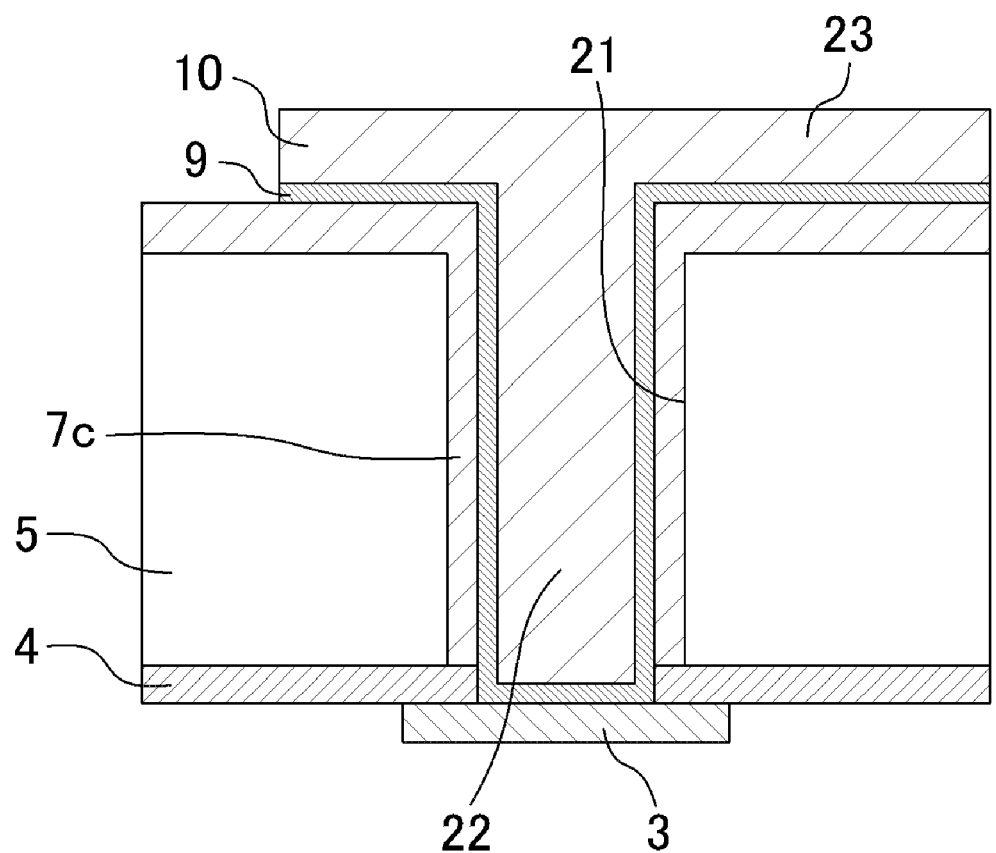
FIG. 8 is a cross-sectional view illustrating the semiconductor device according to the third variation of the first embodiment.

The semiconductor device according to this variation shown in FIG. 8 differs from the semiconductor device according to the first embodiment shown in FIG. 2 in that the second insulating film 6 is not formed on the back surface (second surface) of the silicon device wafer 5, and that the via coating film 7c is also formed on the second surface of the silicon device wafer 5. As a result, an insulating film exists which is continuously formed from the sidewall of the through-via 22 to the second surface of the silicon device wafer 5, thereby sufficiently obtaining insulation between the silicon device wafer 5 and the through-via 22. Moreover, the via coating film 7c made of an insulating polymer having a low dielectric constant covers the uppermost portion of the through-via 22, thereby reducing capacitance between the upper corner of the through-via 22 and the silicon device wafer 5 to provide the advantage of increasing speed. As compared to the first embodiment, the interface between the via coating film 7c and the sidewall 8b does not exist, degradation in yield caused by etching at the interface, or a leakage current into the silicon device wafer 5 via the interface can be prevented to improve reliability. Furthermore, as compared to the second variation of the first embodiment, since the second insulating film 6 is not formed to reduce the depth of the via hole 21 filled with the through-via 22. This is advantageous in filling, etc., thereby achieving further miniaturization.

Second Embodiment

A semiconductor device according to a second embodiment of the present disclosure, specifically, a structure formed by stacking a plurality of semiconductor devices according to the above-described first embodiment (including variations, the same hereinafter) will be described hereinafter with reference to the drawings.

Figure 9:
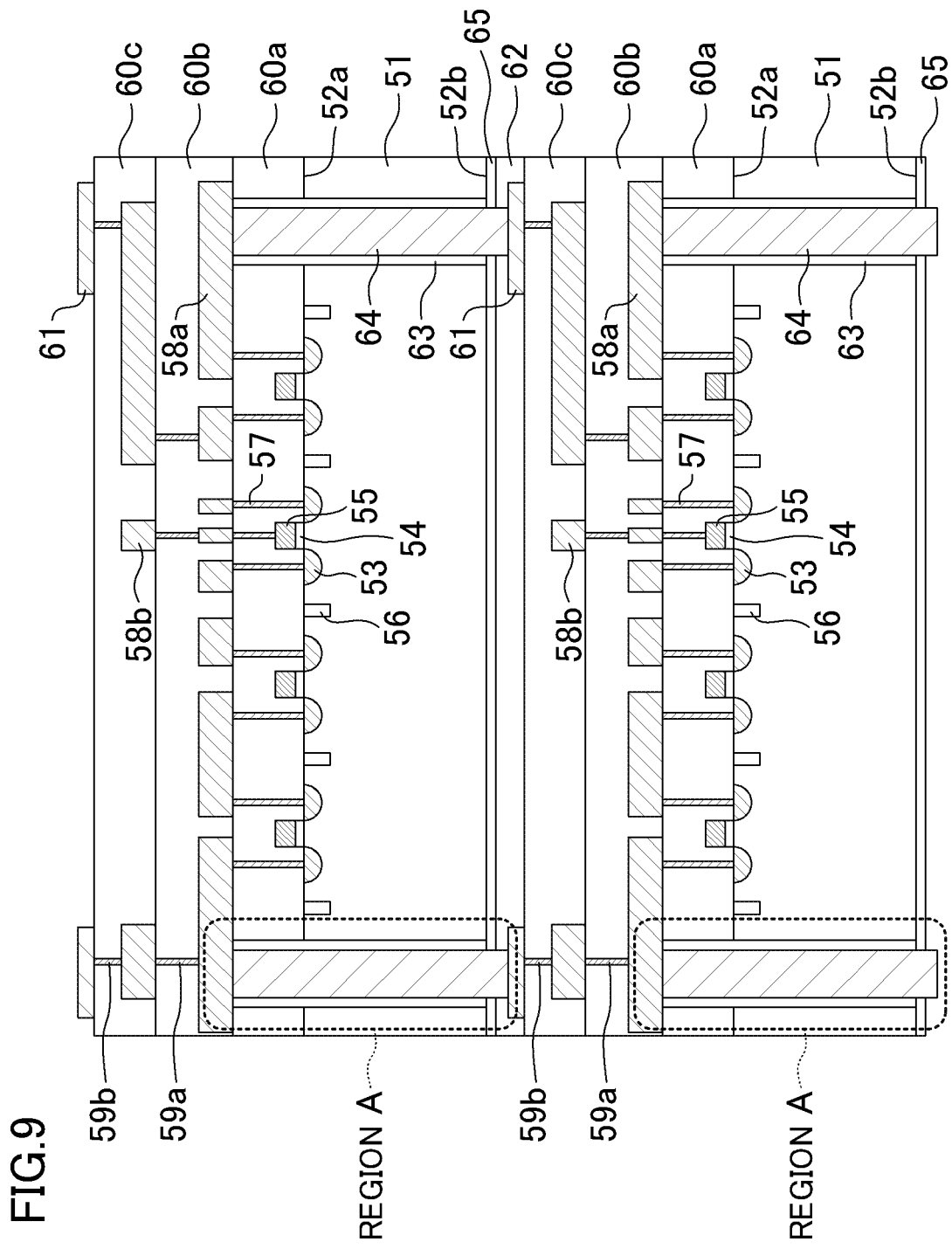
FIG. 9 is a cross-sectional view illustrating an example structure according to a second embodiment.

FIG. 9 illustrates a cross-sectional view of the structure (stacked semiconductor device) according to the second embodiment of the present disclosure.

As shown in FIG. 9, in each of the semiconductor devices constituting the stacked semiconductor device, an impurity region 53 of each of active elements such as transistors and diodes is formed on the surface portion of a semiconductor substrate 51 closer to first surface 52a. A gate electrode 55 is formed on the first surface 52a of the semiconductor substrate 51 with a gate insulating film 54 interposed therebetween. Note that the active elements are electrically isolated by isolations 56 formed on the surface portion of the semiconductor substrate 51 closer to first surface 52a. A first interlayer insulating film 60a is formed on the first surface 52a of the semiconductor substrate 51 to cover the gate electrode 55. Contacts 57 connected to the impurity region 53 and the gate electrode 55 are formed in the first interlayer insulating film 60a. A second interlayer insulating film 60b and a third interlayer insulating film 60c are sequentially stacked on the first interlayer insulating film 60a. In the second interlayer insulating film 60b, a first interconnect 58a connected to the contact 57, and transmitting signals and supplying a power supply voltage in the semiconductor device, and a first via 59a connected to the first interconnect 58a are formed. In the third interlayer insulating film 60c, a second interconnect 58b connected to the first via 59a, and transmitting signals and supplying a power supply voltage in the semiconductor device, and a second via 59b connected to the second interconnect 58b are formed. An electrode pad 61 connected to the second via 59b and extracting signals to the outside is formed on the third interlayer insulating film 60c.

As shown in FIG. 9, a through-via 64 is formed to penetrate the semiconductor substrate 51 from the first surface 52a to the second surface 52b. In this embodiment, the through-via 64 is formed to penetrate the first interlayer insulating film 60a closer to the first surface 52a and an insulating protective film 65 closer to second surface 52b as well. The sidewall of the through-via 64 is covered by the via coating film 63 of the present disclosure. That is, a through-via formation region A of FIG. 9 has the structure of the first embodiment shown in FIG. 2, 4, 6, or 8. Note that, in FIG. 2, 4, 6, or 8, the first surface 52a faces downward and the second surface 52b faces upward in the through-via formation region A of FIG. 9.

The plurality of semiconductor devices formed as above are bonded by an adhesive layer 65, and the semiconductor devices are electrically connected via the through-vias 64, thereby forming a multilayer structure.

Note that, in the multilayer structure shown in FIG. 9, a via coating film 63 which is the same as that on the sidewall of the portion of the through-via 64 in the semiconductor substrate 51 is formed on the sidewall of the portion of the through-via 64 in the first interlayer insulating film 60a closer to the first surface 52a of the semiconductor substrate 51. Instead, different insulating films are used as via coating films on the sidewall of the portion of the through-via 64 in the first interlayer insulating film 60a, and on the sidewall of the portion of the through-via 64 in the semiconductor substrate 51.

Figure 10:
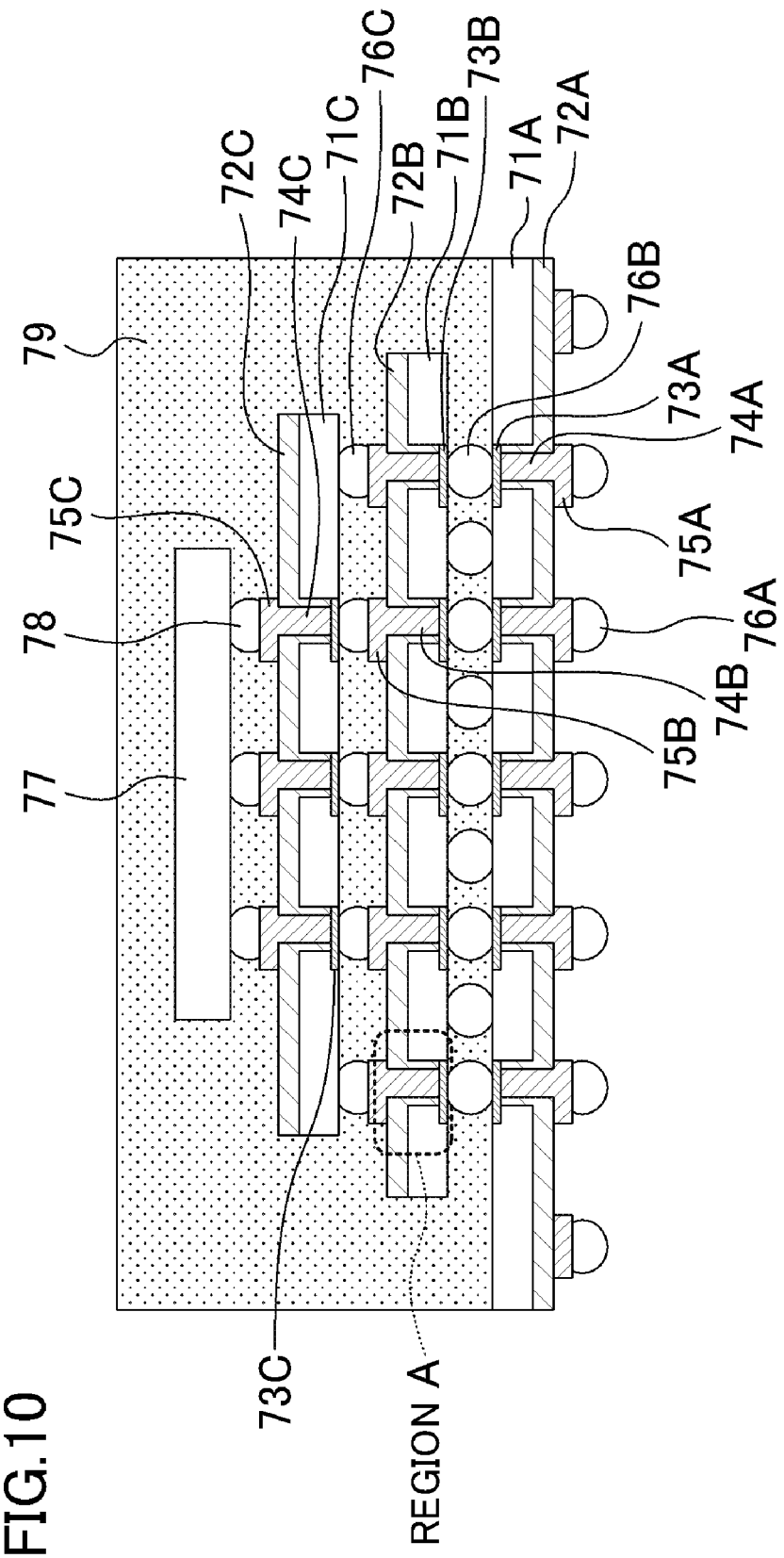
FIG. 10 is a cross-sectional view illustrating an example structure according to the second embodiment.

In the above-described structure according to the second embodiment of the present disclosure, a plurality of semiconductor devices (or a plurality of semiconductor chips, the same hereinafter) can be stacked using the through-vias shown in the first embodiment. As such, the devices can be miniaturized by stacking a plurality of semiconductor devices. While the multilayer structure shown in FIG. 9 has been described using the structure formed by stacking two semiconductor devices, two or more of the semiconductor device as shown in FIG. 10 may be stacked as appropriate. In this case, as shown in FIG. 10, the semiconductor devices may be electrically connected via bumps. Also, an adhesive layer may be provided between two of the semiconductor devices, thereby bonding the semiconductor devices to perform sealing with resin without using bumps.

Specifically, in the multilayer structure shown in FIG. 10, reference characters 71A, 71B, and 71C denote semiconductor substrates. Reference characters 72A, 72B, and 72C denote insulating films which become via coating films. Reference characters 73A, 73B, and 73C denote electrode pads. Reference characters 74A, 74B, and 74C denote through-vias. Reference characters 75A, 75B, and 75C denote interconnects. Reference characters 76A, 76B, and 76C denote bumps. Reference character 77 denotes a semiconductor chip. Reference character 78 denotes a bump. Reference character 79 denotes sealing resin. In this embodiment, a through-via formation region A of FIG. 10 has the structure of the first embodiment shown in FIG. 2, 4, 6, or 8.

Figure 11:
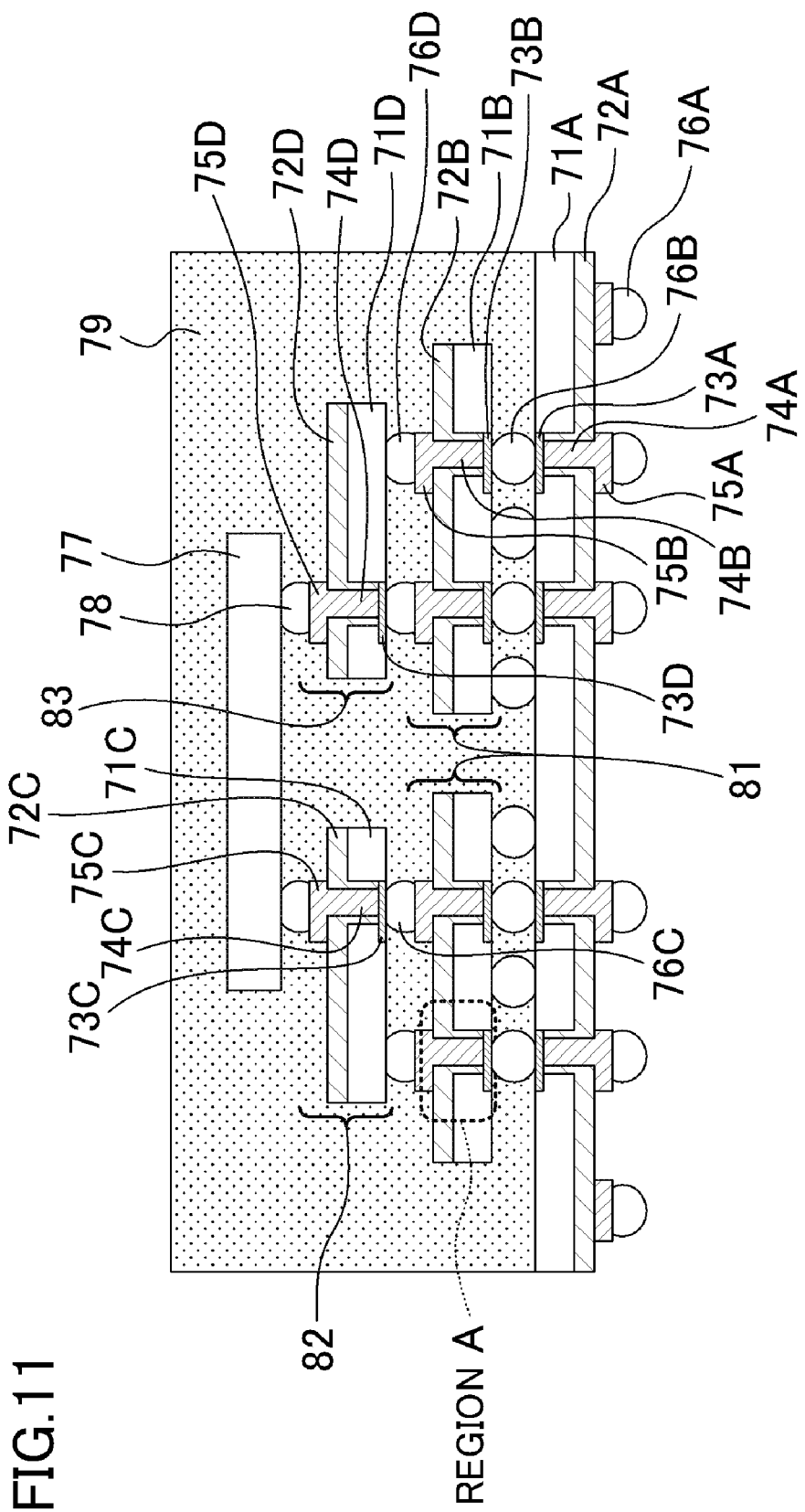
FIG. 11 is a cross-sectional view illustrating an example structure according to the second embodiment.

The second embodiment has been described using, for example, the structure formed by stacking two or more semiconductor chips including logic circuits, i.e., the structure formed by stacking a plurality of semiconductor chips of the same type. Instead, a structure formed by stacking a semiconductor chip including a logic circuit, a semiconductor chip including a memory element, a semiconductor chip including an image sensor, and a semiconductor chip including micro electro mechanical systems (MEMS); i.e., a structure formed by stacking semiconductor chips of different types can be formed. When such a structure is exemplified similar to FIG. 10, the multilayer structure shown in FIG. 11 is obtained. As such, by stacking a plurality of semiconductor chips of different types, the mounting area can be reduced to enable miniaturization of the device.

Specifically, in the multilayer structure shown in FIG. 11, reference characters 71A, 71B, 71C, and 71D denote semiconductor substrates. Reference characters 72A, 72B, 72C, and 72D denote insulating films which become via coating films. Reference characters 73A, 73B, 73C, and 73D denote electrode pads. Reference characters 74A, 74B, 74C, and 74D denote through-vias. Reference characters 75A, 75B, 75C, and 75D denote interconnects. Reference characters 76A, 76B, 76C, and 76D denote bumps. Reference character 77 denotes a semiconductor chip. Reference character 78 denotes a bump. Reference character 79 denotes sealing resin. Reference character 81 denotes a semiconductor chip including a logic circuit. Reference character 82 denotes a semiconductor chip including a memory element. Reference character 83 denotes a semiconductor chip including an image sensor. In this variation, a through-via formation region A of FIG. 11 has the structure of the first embodiment shown in FIG. 2, 4, 6, or 8.

Figure 12:
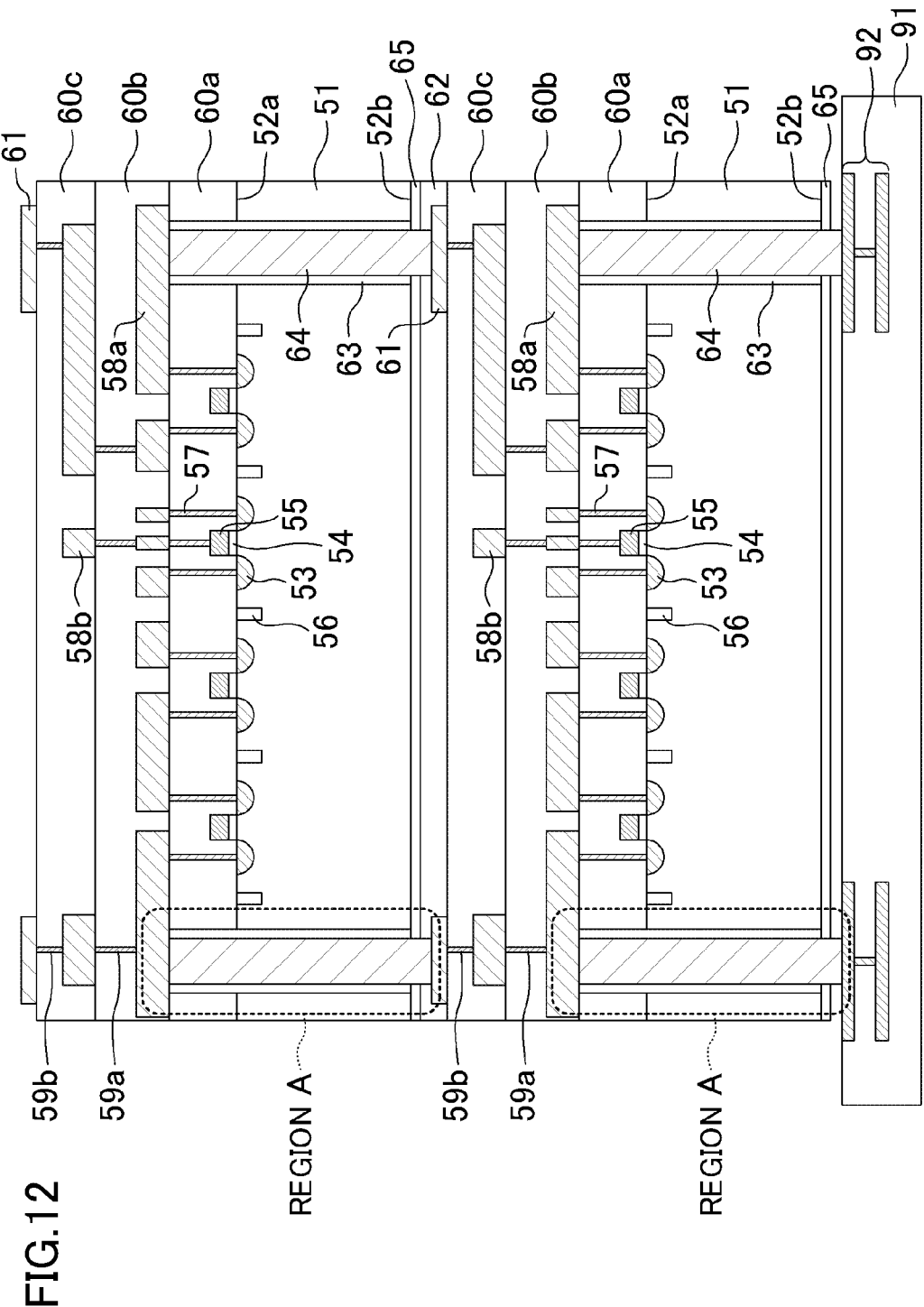
FIG. 12 is a cross-sectional view illustrating an example structure according to the second embodiment.
Figure 13A:
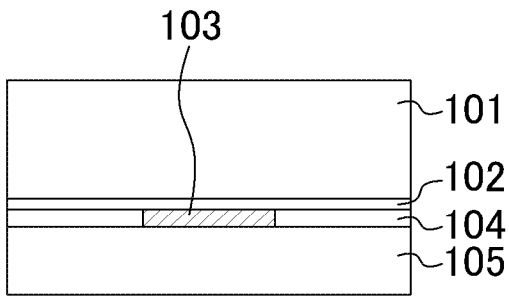
FIGS. 13A-13F are cross-sectional views illustrating steps of a manufacturing method of a semiconductor device according to a conventional example.
Figure 13D:
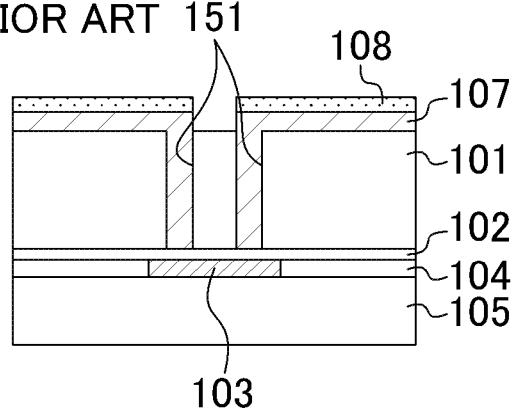
Figure 13B:
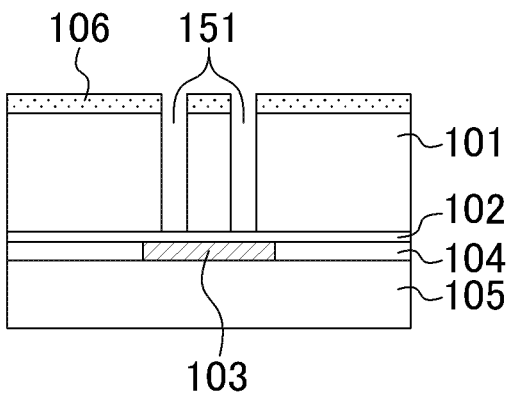
Figure 13E:
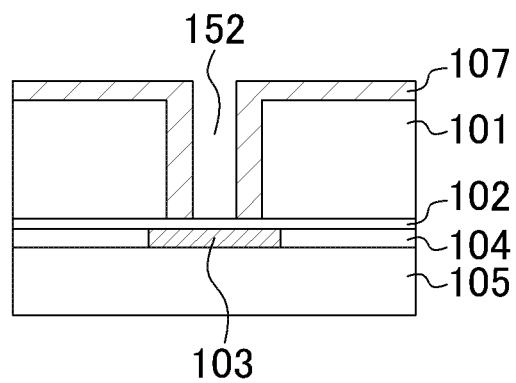
Figure 13C:
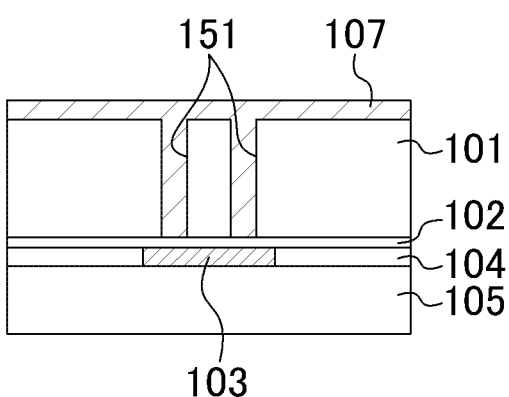
Figure 13F:
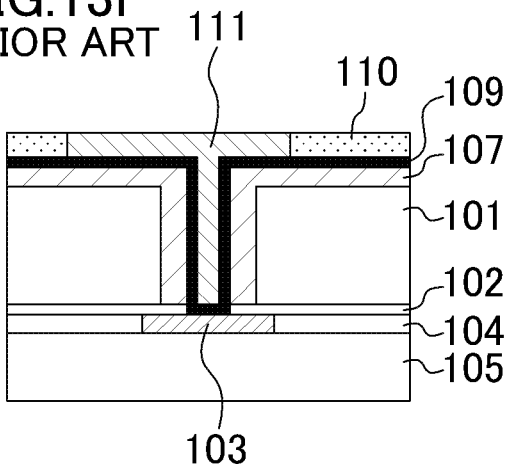
Figure 14:
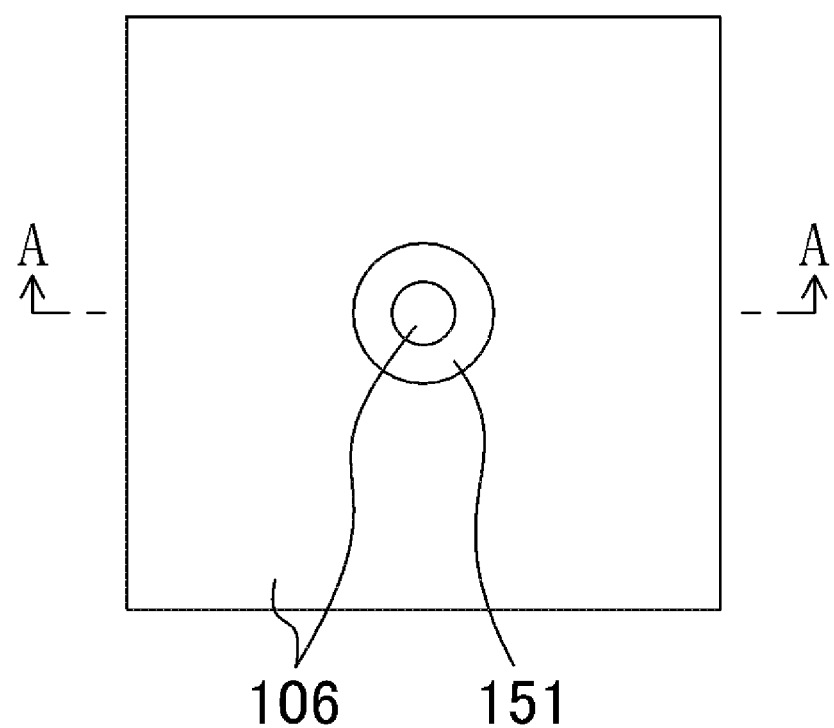
FIG. 14 is a top view illustrating the semiconductor device according to the conventional example after the step of the manufacturing method shown in FIG. 13B has been completed.

In the second embodiment, as shown in FIG. 12, the multilayer structure (structure formed by stacking semiconductor chips of the same type, or structure formed by stacking semiconductor chips of different types) shown in, e.g., FIG. 9 may be mounted on the surface of a printed-wiring board 91 having an interconnect structure 92. As such, by mounting the multilayer structure on the surface of the printed-wiring board 91, the region for wire bonding can be reduced, thereby further reducing not only the mounting area but also parasitic capacitance caused by wire bonding. Clearly, the multilayer structure shown in, e.g., FIG. 10 or 11 may be mounted on a printed-wiring board.

Note that, in the first embodiment (including the first to third variations), an example has been described where the via hole is formed from the back surface (surface opposite to the element formation surface) of the semiconductor substrate, thereby forming the through-via and then, forming semiconductor devices (or semiconductor chips) one by one. Instead, the through-via may be provided by forming the via hole from the front surface (element formation surface) of the semiconductor substrate with another semiconductor substrate stacked on a semiconductor chip. In that case, for example, the metal film 3 shown in FIG. 1A, FIG. 3A, FIG. 5A, or FIG. 7A may be regarded as pads of a lower-positioned semiconductor device (not shown), and the first insulating film 4 may be regarded as an adhesive layer.

What is claimed is:

1. A semiconductor device comprising:
   a semiconductor substrate including a first surface serving as an element formation surface, and a second surface opposite to the first surface;
   a through-via penetrating the semiconductor substrate;
   an insulating via coating film formed between a sidewall of the through-via and the semiconductor substrate;
   an insulating protective film formed on the second surface of the semiconductor substrate; and
   an insulating film formed between the protective film and the sidewall of the through-via, wherein
   the via coating film, the protective film, and the insulating film are different insulating films from each other, and
   the insulating film exists in a substantially same plane as the protective film.

2. The semiconductor device of claim 1, wherein
   an end of the via coating film closer to the second surface is positioned in a substantially same plane as the second surface of the semiconductor substrate, and
   the insulating film covers the end of the via coating film closer to the second surface.

3. The semiconductor device of claim 1, wherein the via coating film is made of an insulating polymer.

4. The semiconductor device of claim 2, wherein an end of the via coating film closer to the first surface is positioned in a substantially same plane as the first surface of the semiconductor substrate.

5. The semiconductor device of claim 1, wherein the protective film is made of silicon nitride.

6. The semiconductor device of claim 1, wherein the insulating film is made of a material more resistant to etching than the via coating film.

7. The semiconductor device of claim 3, wherein the insulating film is a silicon nitride film, a silicon carbide film, or a silicon oxide film.

\* \* \* \* \*